United States Patent [19]

Cointot et al.

[11] 4,375,013

[45] Feb. 22, 1983

[54] DEVICE FOR DIGIT RATE REDUCTION OF PCM-SIGNALS

[75] Inventors: Denis Cointot, Paris; Patrice Langlois, Saint-Maur; Guy de Passoz, Lesigny, all of France

[73] Assignee: Societe Anonyme de Telecommunications, France

[21] Appl. No.: 171,946

[22] Filed: Jul. 23, 1980

[30] Foreign Application Priority Data

Aug. 10, 1979 [FR] France .................................. 79 20445

[51] Int. Cl.³ ............................. G10L 1/00; H04J 3/18
[52] U.S. Cl. ....................... 179/15.55 R; 340/347 DD; 375/27
[58] Field of Search ................... 179/1 SA, 1 SC, 1 P, 179/15.55 R, 15.55 T; 340/347 DD; 370/102, 109, 118; 375/27, 30, 31

[56] References Cited

U.S. PATENT DOCUMENTS

| 3,784,737 | 1/1974 | Waechner ............................ 375/31 |
| 4,005,274 | 1/1977 | Vagliani et al. ............. 179/15.55 R |
| 4,027,102 | 5/1977 | Ando et al. ........................ 179/1 SC |
| 4,066,844 | 1/1978 | Ridings et al. ...................... 370/118 |
| 4,156,111 | 5/1979 | Downey et al. .................... 370/102 |
| 4,179,710 | 12/1979 | Ishiguro et al. ............. 179/15.55 R |

*Primary Examiner*—Emanuel S. Kemeny

*Attorney, Agent, or Firm*—Jacobs & Jacobs

[57] ABSTRACT

A digit rate reducing system for PCM signals comprises a predictor stage, an automatic gain control stage, and a quantizer stage for adaptive quantizing. The predictor stage includes a predictor and a subtractor for subtracting from a sample $\hat{x}_n$ of the PCM input signal a predicted signal $\hat{x}_{pn}$ derived from preceding samples. The subtractor provides a difference signal $d_n$ representing prediction error to the automatic gain control (AGC) stage. A divider in the AGC stage divides the difference signal $d_n$ by m, providing a divided signal $e_n$ to the quantizer stage. In this last stage, a quantizer encodes the divided signal $e_n$ into a signal $Y_n$ of reduced rate. The predictor uses a first adder which receives the predicted signal $\hat{x}_{pn}$ and a reconstituted signal $d_n$ derived from the reduced rate signal $Y_n$; a plurality of shift registers and associated multipliers; and a second adder connected to the outputs of the multiplier. Shift registers $T_1 \ldots T_N$ are coupled to the output of the first adder, and provide a series of delayed signals to multipliers $M_1 \ldots M_N$ for multiplying by respective coefficients $a_i(n)$ derived from the preceding samples. At least one of the predictor coefficients $a_i(n)$ is applied to the quantizer, whereby the type of coding is adapted to the statistical properties (ie, the conditional probability distribution curve) of the PCM input signal.

3 Claims, 7 Drawing Figures

DEVICE FOR DIGIT RATE REDUCTION OF PCM-SIGNALS

BACKGROUND OF THE INVENTION

The present invention relates to a device for digit rate reduction of PCM-signals.

PCM coding is well known. It comprises the steps of sampling analog signals at a so-called sampling frequency and quantizing, according to a logarithmic law, the samples at a rate of 8 binary elements per sample. Such a coding procedure has the drawback of requiring a high digit rate for achieving the quality required by the consumer, as it fails to exploit the statistical properties of the signal to be transmitted.

Digit rate reducing systems have already been described in the prior art. They allow a compression of the digit rate by utilizing, for the transmission of a sample of the signal, the knowledge acquired during the transmission of the preceding samples.

A system of this type has been described in an article by Mr. DIETRICH at the Zürich Seminar 1974. This system consists in an assembly of three cascade-connected stages. The first stage, called predictor stage, enables the PCM input to be replaced by a signal $d_n$ representing the difference between the PCM input signal and the predicted value of this sample as derived from the preceding sample. In the second stage, called automatic gain compression stage, the amplitude of the difference signal $d_n$ from the first stage is divided by an estimator of the mean power of the signal. A third stage, called switching quantizer, effects the optimum coding from the memorized quantizing characteristics which are best adapted to the conditional distributions of probability of the signal from the preceding stage and delivers at the output a digital signal reduced redundancy formed by words of fixed length, namely 4 binary elements per sample. A dual device at reception enables the PCM frame to be recovered and the message to be decoded.

However, such a system, which is satisfactory for the speech signals belonging to the frequency band 0,—3—3—4 KHz sampled at 8 KHz, is not suitable for the other signals which may be transmitted within the frequency band such as data signals, harmonic telegraphy signals or multifrequency signalling signals which are of different statistics. In fact, it is known that for speech signals the spectrum presents a maximum in the vicinity of 700 Hz but for data signals, this spectrum presents a maximum in the vicinity of 2 kHz. Thus, the predictor stage of Mr. DIETRICH which is optimized for the spectrum of the speech signals will no longer be adapted to the other types of signals.

In fact, the predictor stage usually consists of a filter disposed on a negative feedback loop and delivers a sample $\hat{x}_{pn}$ predicted from coefficients C (i) derived from the autocorrelation function of the signal to be processed. However, prediction will be optimum only for a given type of signal and under the provision that this signal is stationary. Now, the speech signal is stationary only for a short time (about 10 ms), so that the coefficients of the predictor should be modified one hundred times per second if an always optimum prediction were desired. In addition, a fixed predictor optimized for a speech signal will provide a poor prediction for a data signal.

Other attempts have been made to achieve digital reduction with devices suitable for speech signals as well as data signals. Such devices generally comprise a fixed predictor the coefficients of which are determined as an acceptable compromise both for data and for speech.

However, the quality of transmission achieved with such systems is insufficient to allow these systems to be introduced into commercial telecommunication networks.

SUMMARY OF THE INVENTION

It is an object of the present invention to provide a predictor stage which derives the coefficients employed in the prediction, said coefficients being adapted to the type of signal in question and, on the other hand, to recognize the laws specific to this signal and to derive therefrom the parameters employed in the quantizing pattern.

The predictor stage according to the invention further allows the digit rate reduction device to be protected against errors, by an appropriate choice of the coefficients.

The predictor stage according to the invention comprises first means for adding the predicted signal $\hat{x}_{pn}$ to the decoded or reconstituted difference signal $\hat{d}_n$ from the automatic gain compression stage AGC, said signals $\hat{x}_{pn}$ and $\hat{d}_n$ being produced during the preceding sampling period T, the resulting value being applied to the input of N shift registers $T_1 \ldots T_i \ldots, \ldots T_N$ introducing delays respectively equal to $T, \ldots iT \ldots NT$ and producing N values $xe_{n-1}, xe_{n-2}, \ldots xe_{n-N}$ which are then respectively multiplied by means of N multiplication circuits with coefficients $a_1, a_2, \ldots a_i \ldots a_N$ derived during the preceding sampling period and memorized, the resulting N products being added by means of a common addition circuit which supplies the new value $\hat{x}_{pn}$ predicted for the incoming sample $x_n$, the coefficients $a_1, a_2, \ldots a_i, \ldots a_N$ are provided by second means substantially comprising N circuits each including means for multiplying the value $xe_{n-1}$ derived at the output of the respective register Ti with the decoded value $\hat{e}_n$ derived from said quantizing stage after preliminary multiplication by a constant $\alpha$. The result of said multiplication is then added to the coefficient $a_i^*(n-1)$, read out from a memory $Z_i$ and derived during the preceding sampling period by means of the addition circuit $W_i$, said result furnished by $W_i$ being multiplied with a constant $(1-\beta)$ by means of a multiplication circuit $U_i$, the result of said multiplication being added to the coefficient $\beta a_{oi}$ (n=1) stored in a memory by means of the addition circuit $K_i$, said second means delivering at the output thereof the sample $a_i$ (n).

In addition, the N coefficients derived by means of the N circuits at each sampling period are applied to the input of the device selecting the quantizing pattern of the quantizer stage and determine a preselection in the type of pattern to allow coding of the information in the quantizer stage.

According to a preferred embodiment of the invention, the coefficients $a_1$ (n+1) are converted into N coefficients $a_i^*$ (n+1), before being applied both to the input of the quantizing pattern selection device and to the input of the first means of the prediction stage in which they are stored in order to be used during the following sampling period, said conversion being intended to maintain the N coefficients $a_1, a_2, \ldots a_i, \ldots a_N$ within a limited domain consisting in comparing each coefficient with the edges of said domain and in substituting for any coefficient outside said domain, the coefficient closest to the limit of said domain.

According to another feature of the invention, the N coefficients $a_i^*(n)$ maintained within the limited domain are applied to the input of a comparator having fixed values stored therein and deriving with the knowledge of the value $a_{oi}(n)$ the value $a_{oi}(n+1)$ best adapted to the statistical properties of the signal to be processed, $a_{oi}(n)$ representing the ith component of the vector Ao (n) towards which A (n) tends in the absence of signal S at the input of the system, the value $a_{oi}(n+1)$ previously multiplied by a constant $\beta$ being applied to the input of the second means of the predictor stage.

According to another feature of the invention, the N coefficients $a_1^*(n) \ldots a_N^*(n)$ are applied to the input of a second comparator which allows selection of a set of quantizing laws adapted to the statistics of the signal to be processed.

BRIEF DESCRIPTION OF THE DRAWINGS

The invention will be more readily understood on reading the following description with reference to the accompanying drawings, in which.

DESCRIPTION OF THE PREFERRED EMBODIMENTS

Figure 1:
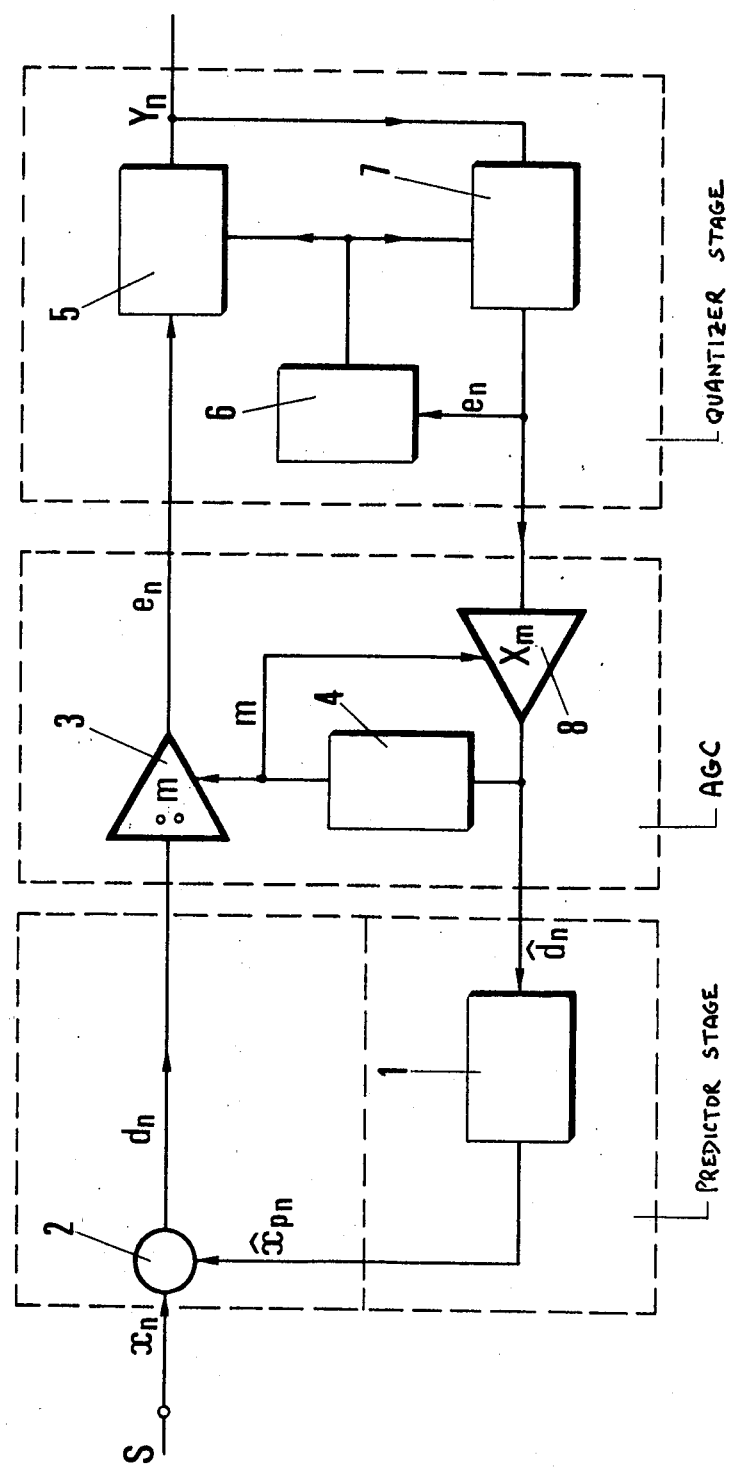
FIG. 1 is a general schematic view of the transmission part of a digit rate reduction device with redundancy reduction.

Referring now to the drawings, the incoming signal S shown in FIG. 1 is a PCM signal resulting from the coding of speech, data or multifrequency signalling signals and is in the form of a PCM frame composed of samples $x_n$. From each sample $x_n$ is subtracted a predicted sample $\hat{x}_{pn}$ supplied by a predictor 1 by means of a subtraction circuit 2 which delivers at the output samples $d_n$ indicative of the difference between the value of the incoming sample $x_n$ and of the predicted sample $\hat{x}_{pn}$ supplied from the predictor 1. This predictor stage will be described in a more detailed manner with reference to the following Figures. It mainly enables the PCM input signal S to be replaced by a difference signal $d_n$ whose variance is less so as to reduce the number of quantizing steps with equivalent quality.

The difference signal $d_n$ is applied to the input of an automatic compression stage (AGC) in which the amplitude of the difference signal $d_n$ is divided by m by a divider 3, the value m being supplied by a mean power estimator 4 in order to increase the dynamic range of the coder.

The third so-called quantizer stage, connected in cascade arrangement with the preceding one, receives the signal $e_n$ from the divider 3, such that $d_n = m e_n$ and effects the coding of the information $e_n$ from the quantizing pattern which is best adapted to the conditional probability distributions of the signal from the stage AGC. It substantially comprises a quantizer 5 converting the samples $e_n$ at a low rate into a series of low rate samples $Y_n$ in accordance with the conditional probability distribution of the signal $e_n$ to be quantized. The choice of the adapted quantizing curve according to whether the signal to be processed is a data signal or a speech signal is effected by a device 6 which receives the signal $\hat{e}_n$ reconstituted by a dual quantizer 7. The dual quantizer 7 connected within a negative feedback loop receives at its input the signal $Y_n$ transcoded by the quantizer 5 and delivers at its output a signal $\hat{e}_n$ identical to the one which is obtained at reception, in the absence of transmission errors. The signal $\hat{e}_n$ is applied to the input of a multiplier-by-m circuit 8 which delivers at its output the value $\hat{d}_n = m\hat{e}_n$ of the reconstituted difference. This value $\hat{d}_n$ is applied on the one hand to the predictor 1 of the predictor stage and on the other hand to the mean power estimator 4.

Figure 2:
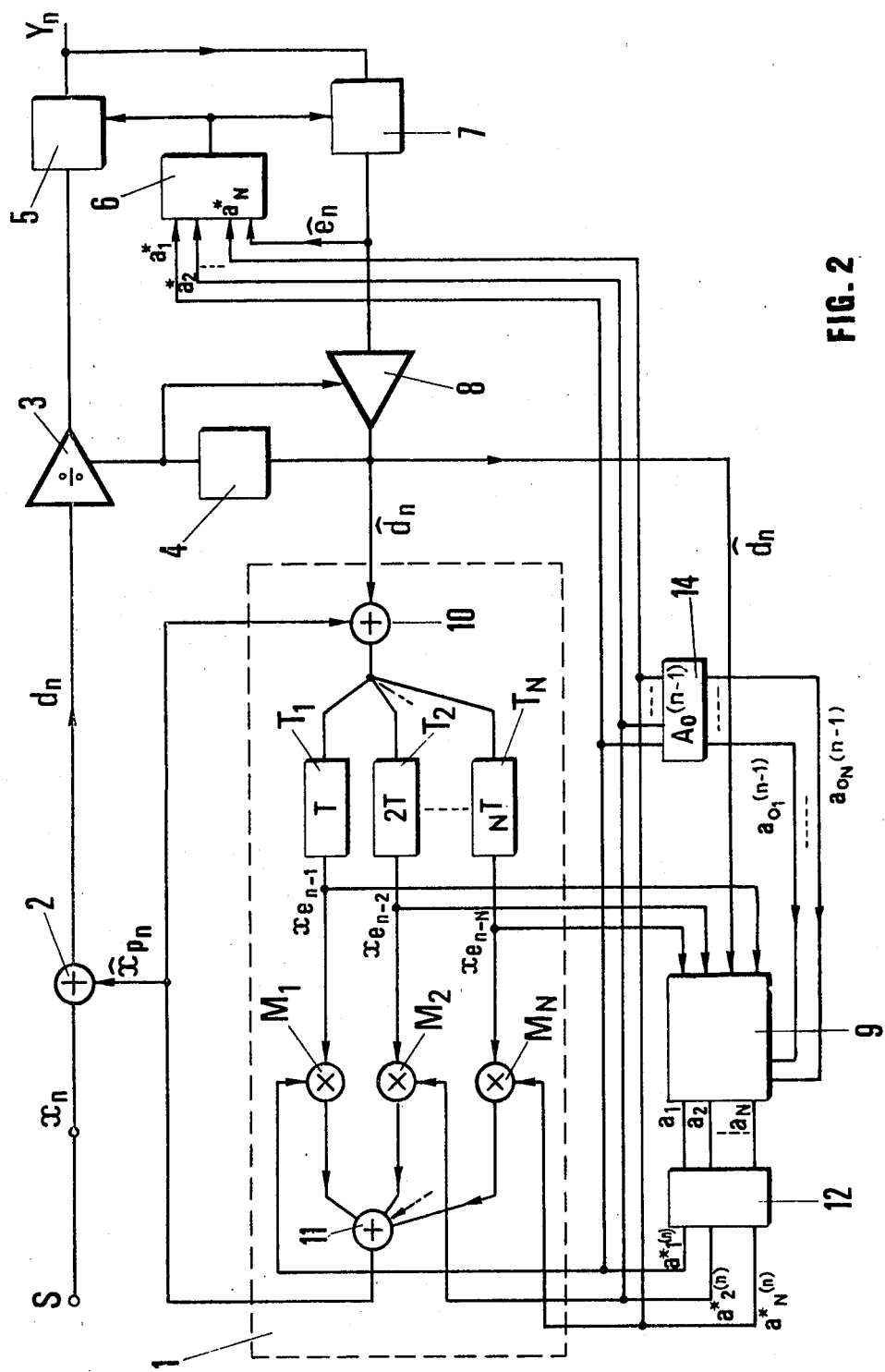
FIG. 2 is a detailed view of a preferred embodiment of FIG. 1, in the case of N coefficients.

With reference to FIG. 2, the predictor 1 is composed of an adder circuit 10 which receives on the one hand the reconstituted difference signal $\hat{d}_n$ delivered by the compression stage AGC of the negative feedback loop and on the other hand the predicted magnitude $\hat{x}$ of the sample n. This adder circuit 10 feeds the sum thus calculated for each sample to N memories $T_1, T_2 \ldots T_N$ producing respectively a delay by a sampling period T, a delay by two sampling periods ... up to a delay by N sampling periods. The number N is advantageously between 2 and 8. The values $xe_{n-1}, \ldots xe_{n-n}$ derived at the output of the N memories $T_1 \ldots T_N$ are multiplied with N coefficients $a_1 \ldots a_N$ respectively by means of N multiplier circuits $M_1 \ldots M_N$. The coefficients $a_1, a_2 \ldots a_N$ are supplied by a device 9 which updates the coefficients at each sampling period according to the criterion of the minimum of the mean quadratic error. The device 9 will be described hereinafter with reference to FIG. 3. The values derived from the N multiplier circuits $M_1, M_2 \ldots M_N$ are added by means of an adder circuit 11 which delivers at its output the predicted value $\hat{x}_{pn}$ of the sample $x_n$.

The predicted value $\hat{x}_{pn}$ is applied on the one hand to the input of an adder circuit 2 deriving at the output the difference value $d_n$ and on the other hand to the input of the adder circuit 10 as has been explained hereinbefore.

The device 9 supplying the coefficients $a_1, a_2 \ldots a_N$ makes possible for the predictor 1 to update the predicted value of each sample $\hat{x}_{pn}$. The vector A (n+1) of the coefficients is advantageously derived according to the invention by means of the following recursive formula or algorithm for calculating the coefficients.

$$A(n+1) = 1 - \beta)[A(n) + \alpha \hat{d}_n \times E_n] + \beta A_o(n)$$

in which $\alpha, \beta$ are constants.

$\alpha$ is the step of the algorithm $\beta$ is a leakage term intended to allow compliance of parameters of the receiver with those of the transmitter in case of divergence subsequent to transmission errors. $A_o(n)$ determines the asymptotic value of the vector A (n) in the absence of signal at the input of the system. When the input signal S is different from O, $A_o(n)$ may take different values depending on that of A (n), i.e. on the statistics of the signal to be processed, as will be explained hereinafter.

The device of FIG. 2 therefore receives the values $xe_{n-1}, xe_{n-2} \ldots xe_{n-N}$ from the memories $T_1, T_2 \ldots$ $T_N$ as well as the value $\hat{d}_n$ from the AGC stage at the output of (8).

Thus, the device 9 is formed by N similar circuits, each delivering a coefficient $a_i$ ($1 \leq i \leq N$)

$$a_i(n+1) = [a_i(n) + \alpha d n x e\ (n-1)](1-\beta) + \beta a_{oi}(n)$$

Figure 3:
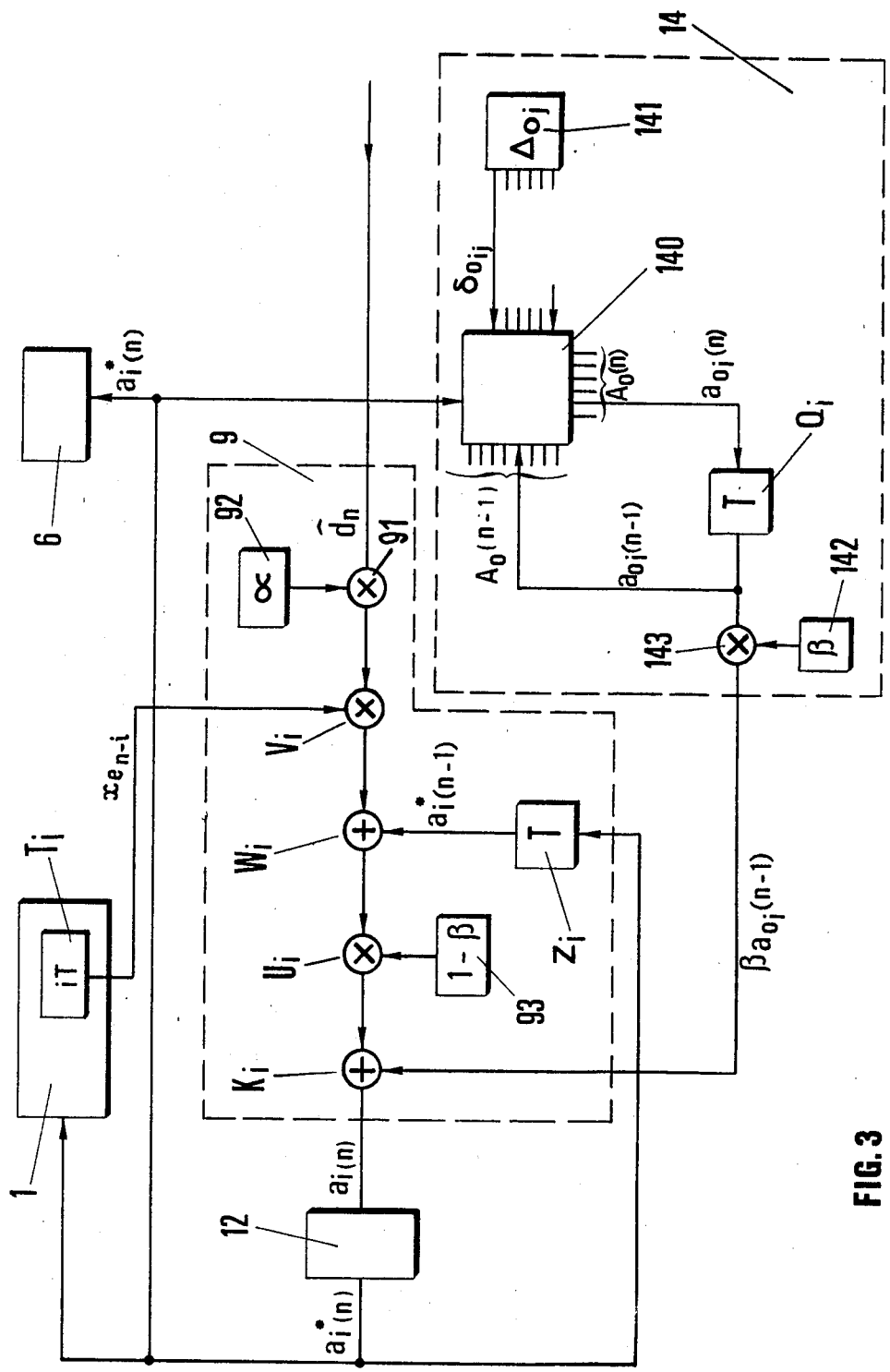
FIG. 3 is a general view, i being any value, of the device 9 for updating the coefficient $a_i$.

FIG. 3 shows the ith circuit forming the device 9. It substantially comprises a multiplier circuit 91 receiving the constant $\alpha$, derived from a memory 92 as well as the reconstituted value $\hat{d}_n$ supplied by the device 8 of the stage AGC. The value $\alpha \hat{d}_n$ is multiplied with $xe_{n-1}$ by means of a multiplication circuit $V_i$. This value $xe_{n-i}$ is derived at the output of the register $T_i$ of the predictor 1. The output of the multiplication circuit $V_i$ is then added to the value $a_i^*(n-1)$ stored in a memory $Z_i$, by means of an addition circuit $W_i$. The output of the addition circuit $W_i$ is multiplied with the factor $(1-\beta)$ stored in a memory 93 by means of a multiplication circuit $U_i$, the result of said multiplication then being added by means of an addition circuit $K_i$ with the ith component $a_{oi}(n-1)$ of the vector $A_{oi}(n-1)$ previously multiplied by the leakage coefficient $\beta$. This value $\beta a_{oi}(n-1)$ is supplied by a device 14. The output of the circuit $K_i$ is the coefficient $a_i(n)$.

The N coefficients $a_i(n)$ from the device 9 are advantageously applied according to the invention to the input of a comparator 12 before being fed to the predictor 1. In fact, the domain of intrinsic stability of the predictor 1 is a limited domain, limited by the values $a_1, a_2 \ldots a_i \ldots a_N$ of the coefficients and determines the rate of decrease of a punctual error of transmission.

Indeed, if the received signal $\hat{d}'_n$ results from the superposition of the true signal $\hat{d}_n$ transmitted and from an error pulse $\epsilon$, it is necessary that the predictor placed at reception not be disturbed beyond certain limits.

Consequently, the coefficients are allocated a domain of evolution giving the predictor an intrinsic stability. A rate of decrease of the error $\epsilon$ is arbitrarily fixed (approximately the pulse response is less than 10% of its initial value after 40 sampling periods).

Figure 4:
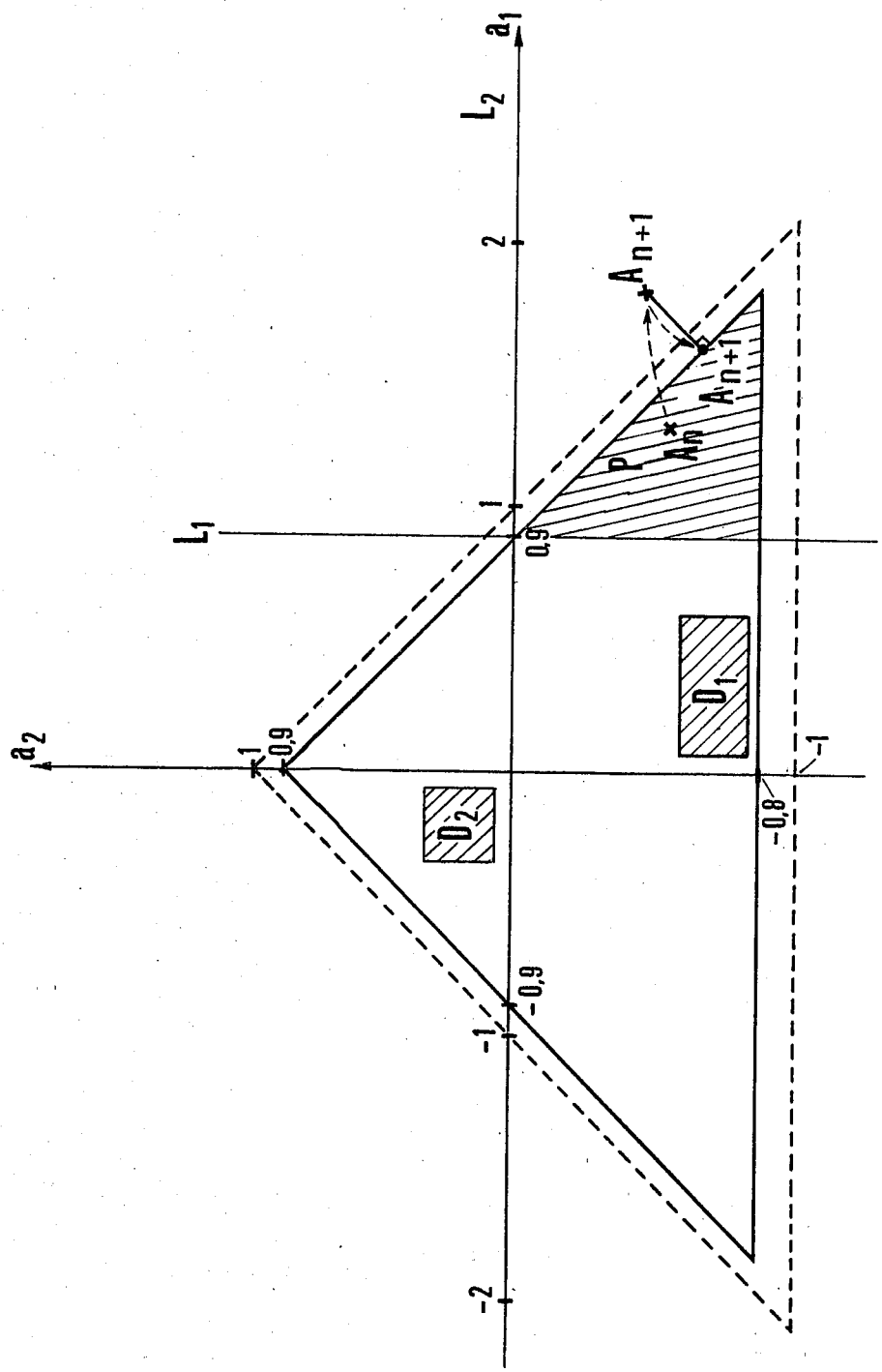
FIG. 4 is a possible view of the domain of evolution of the coefficients $a_1$ and $a_2$ for the adaptive predictor of FIG. 2 for which N=2.

FIG. 4 shows in dotted lines the domain of stability of the coefficients in the case of N=2. The inner triangle $|a_1| + a_2 < 0,9$ $a_2 > -0,8$ defines the domain of rapid convergence within which the coefficients $a_1$ and $a_2$ will not disturb the transmission in the case of punctual error. Let it be assumed that the vector $A(n+1)$ supplied by the device 9 is outside the stability triangle; it is corrected by means of the device 12 to return it to the edge of the stability triangle. Thus, the device 12 is a comparator which compares each of the coefficients $a_1(n+1)$ and $a_2(n+1)$ with the coefficients $a_1(n+1)$ and $a_2(n+1)$ by the coefficients $a_1^*(n+1)$ and $a_2^*(n+1)$ of this closest point located on the triangle. The device 12 therefore transmits:

$a_1^*(n+1)$ et $a_2^*(n+1)$ $a_1^*(n+1) = [\text{sign } a_1(n+1)] \times$ $$\min\left[|a_1(n+1)|, \frac{|a_1(n+1)| - a_2(n+1) + 0.9}{2}, (1.7)\right]$$

$a_2^*(n+1) =$

-continued $$\max\left[-(0.8), \min\left\{a_2(n+1), \frac{a_2(n+1) - |a_1(n+1)| + 0.9}{2}\right\}\right]$$

In addition, the localization of the coefficients in the domain of stability makes it possible to recognize the nature of the input signal S (for example speech signal or data signal). In fact, the statistical distribution of the vector $\{A(n)\}$ of the coefficients of a speech signal describes a domain P which is for example defined by the straight line $L_1$ such that $a_1 \geq 0.9$ and $a_2 < 0$.

On the contrary, the usual statistical distribution of the data signal is such that $a_1 < 0.9$. Certain data signals $D_1$ are such that $a_1 < 0.7$ and $a_2 < 0$. Other data signals $D_2$ may be envisaged such that $a_1 < 0$, $a_2 > 0$. Thus, the various types of possible signals which may be present at the input correspond to vectors of coefficients $A(n)$ at the output of the device 9 located within the domain of stability but in sectors which do not intersect.

The determination of the position of each coefficient vector $A^*(n)$ after correction by means of the comparator 12, is used according to the invention in the choice of the quantizing pattern supplied by the quantizer stage (5, 6, 7). In fact, the device 5 has stored in memory various quantizing patterns both for the speech signals and for the data signals. The switching quantizer systems of the prior art processed solely speech signals, by means of the value $\hat{e}$ supplied by the dual quantizer 7, and the determination of the appropriate quantizing curve was made solely from the value $\hat{e}_n$ supplied by the device 7.

The decision criterion according to the invention is no longer supplied solely by $\hat{e}_n$ but also by the knowledge of $A_i^*(n+1)$ which unequivocally determines whether it is a speech signal P, a data signal $D_1$ or $D_2$, etc. The knowledge of $A_i^*(n+1)$ gives the device 6 the role of selector of the quantizer curve stored in one of the devices 5 or 7 of the quantizer stage according to whether it is a question of direct or dual conversion. Taking the case of N=2 of FIG. 4, it will suffice to determine $a_1^*$ to know whether it is a question of a speech signal or of a data signal: if $a_1^* > 0.9$, it is a speech signal and if $a_1^* < 0.9$, it is a data signal. This embodiment will be illustrated by means of FIG. 6, for which the choice of the quantizer pattern (speech or data) is given by the knowledge of $a_1^*$. Such a choice makes it possible to have a quantizing curve which is always adapted, a better signal-to-noise ratio and therefore a better quality with equal rate.

The device for predicting the coefficients according to the invention further employs the coefficients $a_{oi}(n)$ of the vector $A_n(n)$, asymptotic value of the vector $A(n)$ in the absence of signal at the input. With reference to FIG. 2, there is provided according to the invention a device 14 for selecting the coefficients $A_o(n)$ which makes it possible to choose coefficients $A_o(n)$ adapted to the statistics of the signal to be processed. This device 14 substantially comprises a memory 141 containing k vectors $\Delta_{oj}$ of N components and a comparator which compares the vector $A_o(n-1)$ previously used as well as the vector of the coefficients $A^*(n)$ supplied by the device 12 to the different vectors $\Delta_{oj}$ suitably chosen in accordance with the statistics of the signal to be processed (data, speech).

This device 14 is illustrated in FIG. 3 which illustrates the processing of the ith component of the vector $A^*(n)$. The coefficient $a_i^*(n)$ is applied to the input of a comparator 140 which receives the component $\delta_{oij}$ of the vector $\Delta_{oj}$ contained in the memory 141. The comparator 140 also receives the component $a_{oi}(n-1)$ supplied by a shift register $Q_i$ which delays by a time T the value $a_{oi}(n)$ supplied at the output of the comparator 140. The comparator 140 supplies at its output the best adapted value $\delta_{oij}$ knowing that $a_{oi}(n-1)$ and $a_i*(n)$ have, or have not, a value characteristic of the data or of the speech. The coefficient $a_{oi}(n-1)$ supplied by the register $Q_i$ is multiplied by $\beta$ stored in the memory 142 due to the multiplication circuit 143, then applied to the input of the addition circuit $K_i$ to be added therein to the value supplied by the multiplication circuit $U_i$ of the device 9.

In practice, we may limit ourselves to J=2. Indeed $\delta_{op}$ and $\delta_{od}$ will be distinguished according to whether it is a speech signal or a data signal.

Thus, the fact of having stored in memory a plurality of possible values $\Delta_j$ for $A_o(n)$ makes it possible to adopt a rather large value of the leakage $\beta$ without having too high a value for the constant $\alpha$ and therefore to allow a good immunity of the algorithm to the errors of transmission whilst preserving a good adaptation of the predictor.

Figure 5:
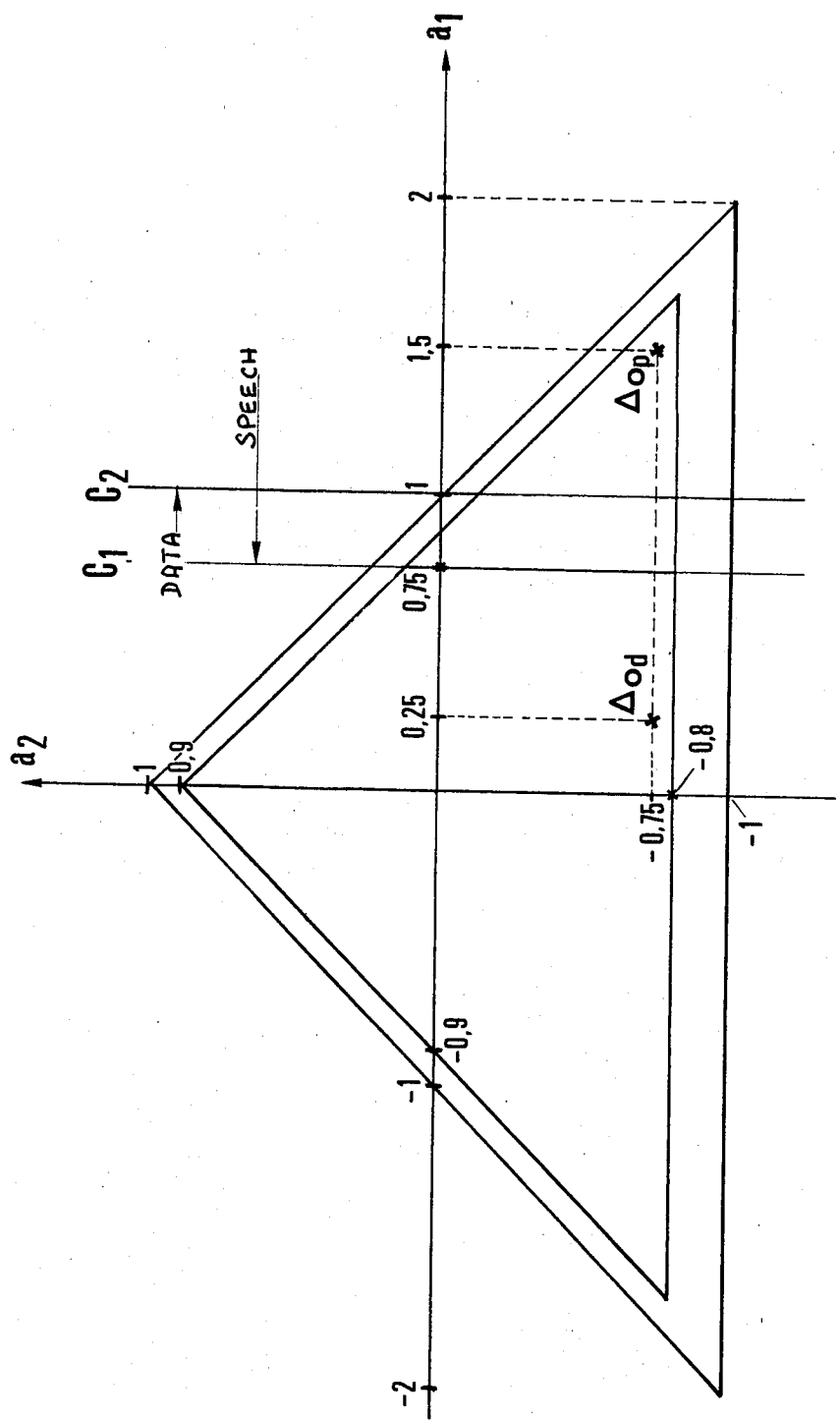
FIG. 5 illustrates the selection of the vector $A_o$ in the case of the embodiment of FIG. 4 for which N=2.

FIG. 5 applied to the case of N=2 concretely illustrates the choice of the coefficient $A_o(n)$. As for the choice of the coefficient $A^*(n+1)$ with respect to coefficients $A^*(n)$, in the domain of stability we may limit ourselves to recognizing the position of $a_1^*(n)$ with respect to two reference values $\delta_{op}$ and $\delta_{od}$ to know which value $a_o(n)$ will be chosen. The straight lines $C_1$ and $C_2$ are plotted such that $a_1=0.75$ and $a_1=1$ respectively and, knowing $a_{o1}(n-1)$ and $a_i^*(n)$, a value $a_{o1}(n)$ is adopted equal to one of the two values $\delta_{op}$ and $\delta_{od}$ according to whether one is in one sector or the other of the domain of stability. In fact, when $a_1^*$ becomes less than 1, it is presumed that it is a data signal and when $a_1^*$ becomes greater than 0.75, it is assumed that it is a speech signal.

The sector of the stability triangle of the coefficients included beween the straight lines $C_1$ and $C_2$ also makes it possible to derive $a_{o1}(n)$ due to the knowledge fo $a_{o1}(n-1)$.

The following table summarizes the various possibilities for the choice of $a_{o1}(n)$ in accordance with the coefficients $a_1^*(n)$ and $a_{o1}(n-1)$:

| $a_{o1}(n-1)$ | $\delta_{op}$ | $\delta_{od}$ | $\delta_{op}$ | $\delta_{od}$ |
|---|---|---|---|---|
| $a_1^*(n)$ | >0.75 | <1 | ≦0.75 | ≧1 |
| $a_{o1}(n)$ | $\delta_{op}$ | $\delta_{od}$ | $\delta_{od}$ | $\delta_{op}$ |

Such a choice gives the system an additional stability with respect to errors and a better adaptation to the statistics of the signal to be processed.

In this example, the value $a_{o2}(n)$ has been chosen to be equal to $-0.75$ whatever n is, but it would also be possible to update $a_{o2}(n)$ at each instant.

Figure 6:
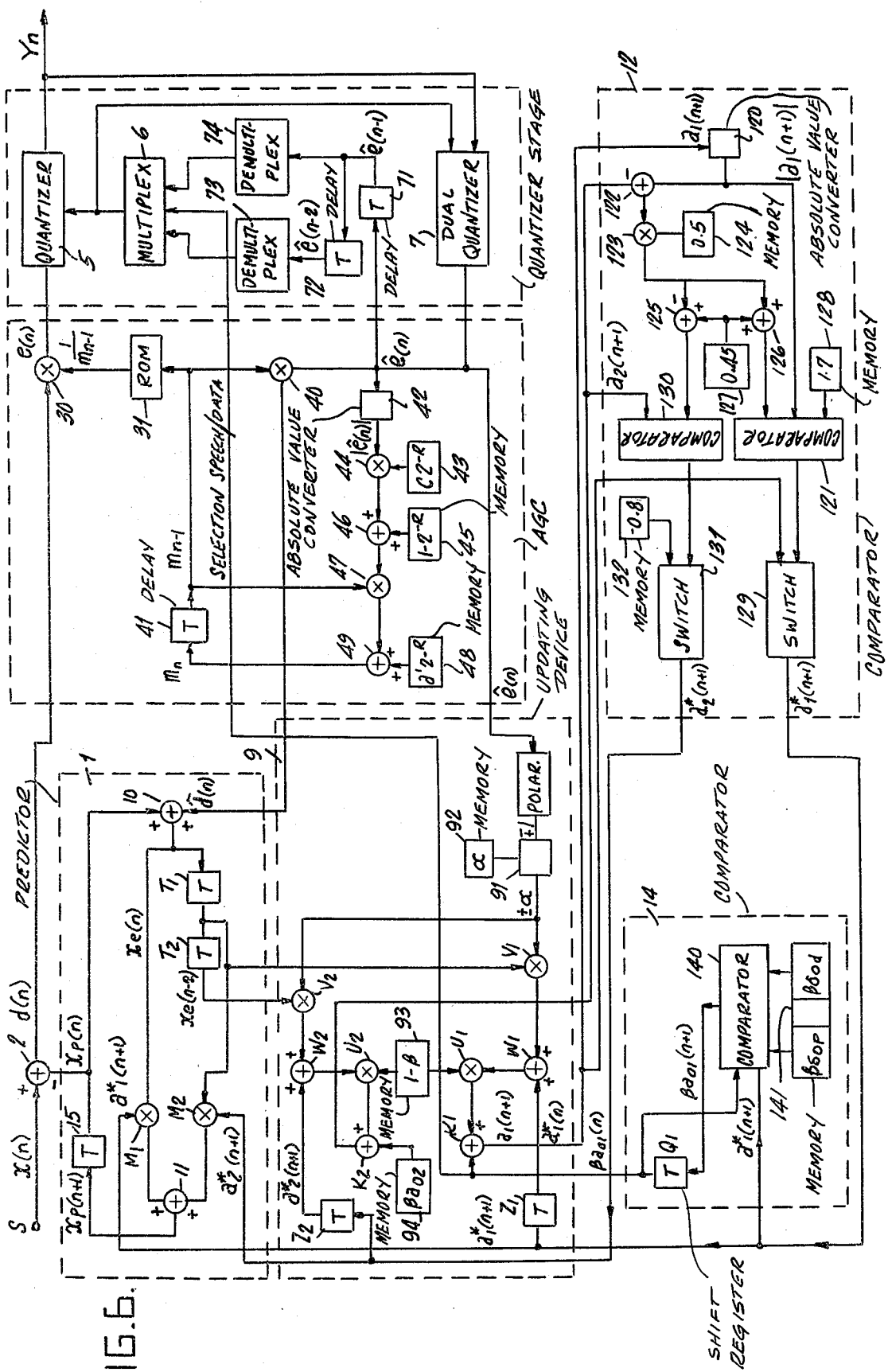
FIG. 6 is a preferred embodiment of the invention of the device of FIG. 2 for which N=2.

FIG. 6 shows a preferred embodiment of the invention in the case of N=2. The predictor 1 is composed of the addition circuit 10, registers $T_1$ and $T_2$, multiplication circuits $M_1$ and $M_2$ and finally the addition circuit 11. In this embodiment, the multiplication circuit $M_1$ directly receives the non-delayed coefficient $xe_n$ whereas the multiplication circuit $M_2$ receives the coefficient $xe_{n-1}$ from the register $T_1$. In compensation, a register 15 disposed at the output of the addition circuit 11 delays the coefficient $x_p(n)$ at the input of the addition circuit 2.

The device 9 which calculates the coefficients $a_1(n)$ and $a_2(n)$ receives the polarity of the decoded value $\hat{e}_n$ from the dual quantizer 7 and multiplies it by means of the multiplication circuit 91 with the constant $\alpha$ stored in the memory 92. In fact, it suffices that the device 9 knows the polarity of $\hat{e}_n$ for calculating the coefficients.

The two multiplication circuits $V_1$ and $V_2$ multiply the polarity $\hat{e}_n$ respectively with $xe_{n-1}$ and $xe_{n-2}$ from the registers $T_1$ and $T_2$ of the predictor 1 and supply factors which are then respectively added to the $a_1^*(n)$ and $a_2^*(n)$ previously derived and stored in the memories $Z_1$ and $Z_2$. The outputs of the addition circuits $W_1$ and $W_2$ are then multiplied respectively by $1-\delta$ stored in a memory 93 by means of the multiplication circuit $U_1$ and $U_2$. The outputs of the multiplication circuits $U_1$ and $U_2$ are then added to the values $\beta a_{o1}(n)$ and $\beta a_{o2}(n)$ respectively by means of the addition circuits $K_1$ and $K_2$. The values $\beta a_{o1}(n)$ and $\beta a_{o2}(n)$ are respectively stored in the memories $Q_1$ and 94. At the output of the addition circuits $K_1$ and $K_2$, $a_1(n+1)$ and $a_2(n+1)$ are respectively derived and applied to the input of the comparison circuit 12.

The coefficient $a_1(n+1)$ supplied by the addition circuit $K_1$ is converted into a positive coefficient $|a_1(n+1)|$ by means of a circuit 120. This coefficient $|a_1(n+1)|$ is then on the one hand applied to the input of a comparator 121, on the other hand subtracted from the coefficient $a_2(n+1)$ by means of the subtractor circuit 122. The result of the subtraction made by 122 is multiplied by the constant 0.5, read out from the memory 124, by means of a multiplication circuit 123, said result being applied to the input of two addition circuits 126 and 125 with opposite polarities. The addition circuit 126 adds the result derived at the output of the circuit 123 with a constant 0.45 stored in a memory 127. The output of the circuit 126 is applied to the input of the comparator 121 which also receives the constant 1.7 supplied by the memory 128 and the value $|a_1(n+1)|$ from the circuit 120.

The result of the comparison, more precisely the minimum of these three values, is applied to the input of a switch device 129 which also receives at its input the coefficient $a_1(n+1)$ supplied by the circuit $K_1$ of the device 9. At the output of the switch device 129 there is derived a coefficient $a_1^*(n+1)$ the polarity of which is that of $a_1(n+1)$ and the value of which is the minimum of $|a_1(n+1)|$, of $$\frac{|a_1(n+1) - a_2(n+1) + 0.9|}{2}$$

and of 1.7 in order to remain in the domain of stability.

In the same way, a comparator 130 receives on the one hand the coefficient $a_2(N+1)$ and on the other hand the result of the subtraction of the constant 0.45 supplied by the memory 12 and the value from the multiplication circuit 123, said subtraction being effected by the circuit 125. The result of the comparison, more precisely the minimum, effected by the comparator 130 is supplied to the input of a switch circuit 131 which also receives the value 0.8 supplied by the memory 132 and derives at its output the coefficient $a_2^*(n+1)$ which represents indeed the maximum of $-0.8$ and the value $$\min\left[a_2(N+1), \frac{a_2(N+1) - |a_1(n+1)| + 0.9}{2}\right]$$

The coefficients $a_1^*(n+1)$ and $a_2^*(n+1)$, thus possibly corrected to remain within the stability triangle, are applied to the input of the memories $Z_1$ and $Z_2$ respectively of the device 9. The memories $Z_1$ and $Z_2$ are in fact delay lines which supply the results at the end of a time T, equal to the sampling period, at their output in order to be used for the following sample in the calculation of $\hat{x}_p(n+1)$.

The coefficient $a_1^*(n+1)$ from the switch device 129 is also applied to the input of a comparison device 14 which compares $a_1^*(n+1)$ with digital values $\beta\delta_{op}$ and $\beta\delta_{od}$ stored in a memory 141. The previously calculated coefficient $\beta a_o(n)$ stored in the memory $Q_1$ (which is in fact a shift register delaying by a time T), are also applied to the input of the comparator 140 to be compared with the two values $\beta\delta_{op}$ and $\beta\delta_{od}$.

This comparator 140 supplies at its output a coefficient $\beta a_{o1}(n+1)$ in accordance with the criteria of selection explained with reference to FIG. 4. The coefficient $a_{o1}(n)$ is then, on the one hand, applied to the input of the addition circuit $K_1$ and, on the other hand, used by the quantizing stage.

The coefficient $a_1^*(n)$ is usually applied to the input of a device 6 for selecting the quantizing pattern of the quantizing stage. However, according to the device of FIG. 6, the coefficient $a_{o1}(n)$ is applied to the input of the device 6 without departing from the scope of the invention. In fact, $a_1^*(n)$ is employed in the calculation of $a_{o1}(n)$.

The device 6, which in fact is a multiplexer, receives the information $\hat{e}(n-2)$ and $\hat{e}(n-1)$ from two demultiplexers 73 and 74. The demultiplexer 74 receives the information $\hat{e}(n-1)$ from the dual quantizer 7 and delayed by means of the delay line 71. The demultiplexer 73 receives the information $\hat{e}(n-2)$ from the delay line 71 and delayed again by a time T in the delay line 72. The multiplexer 6 supplies at the output the addresses allowing the signal $e_n$ to be suitably quantized in the quantizer 5 according to whether the signal is a data or a speech signal. The quantizer 5 may have stored in memory various quantizing curves for each type of signal: (data $D_1$, data $D_2$, speech p . . . etc.). It is the multiplexer 6 which supplies the addresses, on the one hand, to the quantizer 5 and, on the other hand, to the dual quantizer 7 placed on the negative feedback loop, to enable it to decode the outgoing $Y_n$.

The decoded value $\hat{e}_n$ supplied by the dual quantizer 7 of the quantizer stage is also applied to the input of an AGC device which derives at the output the value $m_n$ of the compression rate corresponding to the sample n. This AGC device substantially comprises a first circuit 42 supplying at its output the absolute value $|\hat{e}_{(n)}|$. This value is then multiplied with the constant $C\,2^{-R}$ stored in the memory 43 by means of the multiplication circuit 44. The output of the circuit 44 is added to the constant $(1-2^{-R})$ stored in the memory 45 by means of an addition circuit 46. The output of the circuit 46 is multiplied with the value $m_n$ of the preceding sample supplied by the memory 41 by means of the multiplication circuit 47. The output of the circuit 47 is added to a constant $a'\,2^{-R}$ stored in the memory 48 by means of the addition circuit 49. At the output of the circuit 49, $m_n$ is derived and is applied to the input of the memory 41 in order to be available during the following period. The value $m_{n-1}$ from the register 41 is introduced into a memory 31 in which it is inverted into $1/m_{n-1}$.

The value $m_{n-1}$ supplied by the memory 41 and the value $\hat{e}(n)$ supplied by the dual quantizer 7 are multiplied by means of the multiplication circuit 40 and the result $\hat{d}(n)$ of said multiplication is applied to the input of an addition circuit 10 with the value $x_p(n)$ calculated by the predictor system of the invention for the preceding sample.

The predictor of FIG. 6 substantially comprises two demultiplication circuits $M_1$ and $M_2$ receiving for $M_1$ the value xe (n) derived at the output of the addition circuit 10 and for $M_2$ the value xe (n−1) derived at the output of the register $T_1$. The values derived at the output of the multiplication circuit $M_1$ and $M_2$ respectively by multiplication with $a_1^*(n+1)$ and $a_2^*(n+1)$ are added by means of the addition circuit 11, then the result obtained $x_p(n+1)$ is delayed by means of the delay line 15 which feeds the sample $x_p(n)$ on the one hand to the input of the addition circuit 2 and on the other hand to the input of the addition circuit 10. Such an embodiment of the predictor makes it possible to calculate in advance $x_p(n)$ and consequently to be free from the problem of significant calculating times in practice.

Figure 7:
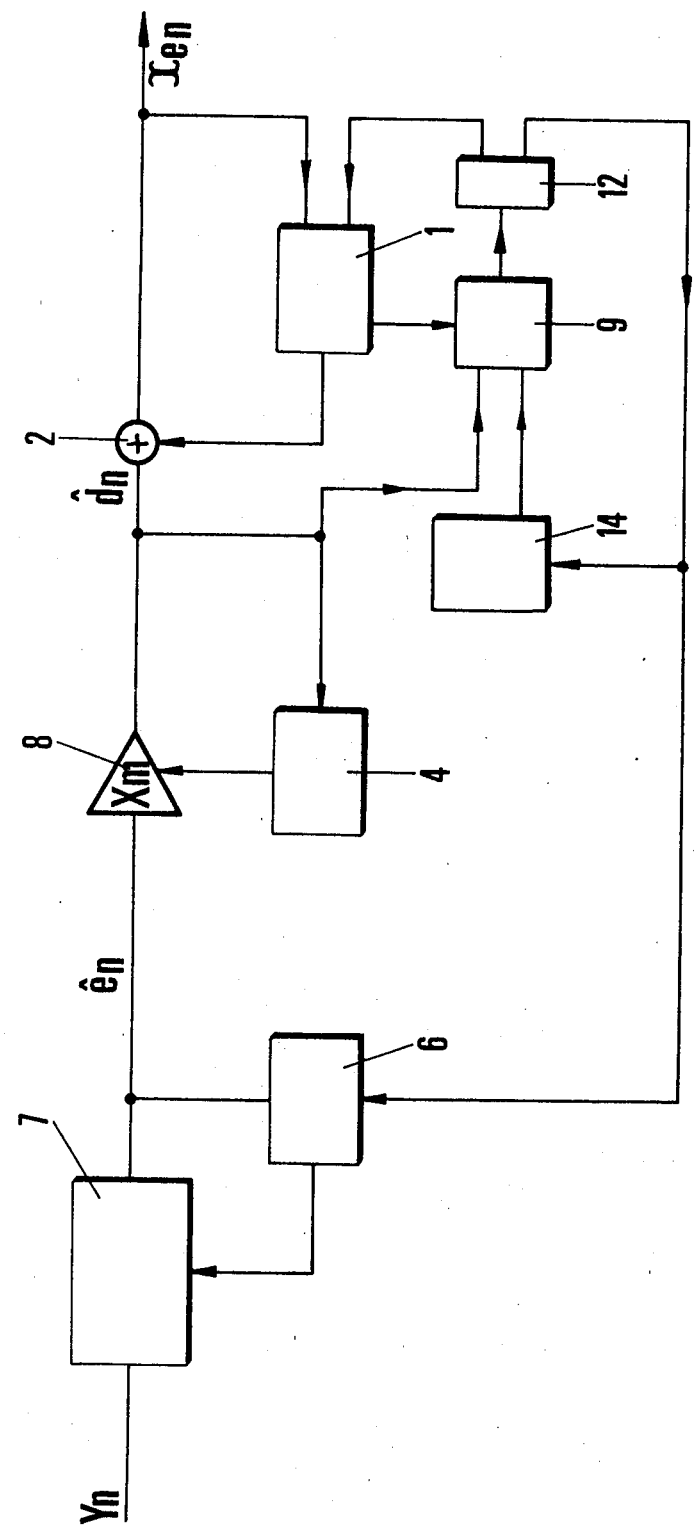
FIG. 7 schematically shows the reception part of the device according to the invention.

The addition circuit 2 effects the difference between the received sample x (n) and the predicted sample $x_p(n)$ supplied by the prediction system of the invention and the result $d_n$ is multiplied with $1/m_{n-1}$ by means of a multiplication circuit 30, which replaces the divider-by-m of FIG. 2, said $1/m_{n-1}$ being derived from the read-only memory 31 as previously described. At the output of the multiplication circuit 30, a value $e_n$ is obtained which is transcoded by means of a quantizer 5. At the output of the quantizer 5 is obtained a signal $Y_n$ the bit rate of which is four bits per sample. This signal $Y_n$ is transmitted in line and received by means of an identical reception device without it being necessary to transmit on a parallel channel the coefficients of the predictor or the value m of the compression rate. All the parameters are derived, in reception, from the signal $Y_n$ transmitted in line by means of the reception device as shown schematically in FIG. 7.

The signal $Y_n$ is received by the dual quantizer 7 which is addressed by the multiplexer device 6 and supplies at the output a signal $\hat{e}_n$. This signal $\hat{e}_n$ is applied to the input of a multiplier-by-m circuit 8, m being the compression rate supplied by the mean power estimator 4. The signal $\hat{d}_n$ derived at the output of the device 8 is applied on the one hand to the input of the estimator 4 and on the other hand to the input of the device 9 to enable calculation of the coefficients in accordance with the values $xe_{(n-i)}$ from the predictor 1. The coefficients $a_i(n)$ from the device 9 are corrected by means of the comparator device 12 to maintain them within the domain of stability. These limited coefficients are applied on the one hand to the input of the multiplexer device 6 to intervene in the choice of the characteristic quantizing curve and, on the other hand, to the input of the predictor 1.

The predictor supplies a predicted signal $\hat{x}_p(n)$ at the input of the addition circuit 2, this making it possible to reconstitute a sample $xe_n$ similar to the one at emission. This sample $xe_n$ is applied at each instant to the input of the predictor 1 and intervenes in the calculation of the following sample.

A comparator device 14 makes it possible, in the same way as at transmission, to derive the coefficients $a_{oi}(n)$ corresponding to the absence of signal from the coefficients $a_{oi}(n+1)$ and $a_i(n)$.

These coefficients $a_{oi}(n)$ are applied to the input of the device 9.

The reception device therefore makes it possible to derive from the signal $Y_n$ transmitted in line, the parameters, in the absence of transmission errors, of the transmission end without the necessity for information being sent on an additional channel, the sample $xe_n$ being identical, apart from the noise, to $x_n$.

Moreover, the predictor stage of the invention protects the whole redundancy reduction device from transmission errors or even from transcoding errors and gives it a role both of selecting the quantizing pattern of the quantizing stage and of protecting and controlling the evolution of the coefficients themselves.

What is claimed is:

1. A digit rate reducing system for an input PCM signal S, said signal S including a plurality of samples $x_n$ having a period T, comprising a predictor stage, an automatic gain compression AGC stage, and a quantizer stage in cascade arrangement;
   said predictor stage comprising predictor means for deriving a predicted signal $\hat{x}_{pn}$ from a plurality of preceding samples $x_n$, and subtractor means for substracting from an input signal $x_n$ said predicted signal $\hat{x}_{pn}$, to form a difference signal $d_n$ representing prediction error;
   said automatic gain compression AGC stage comprising divider means for dividing the amplitude of said difference signal $d_n$ to form a divided signal $e_n$;
   said quantizer stage comprising first quantizing means for encoding said divided signal $e_n$ to form a signal $Y_n$ of reduced rate relative to said signal S, and second quantizing means responsive to said signal $Y_n$ for providing a decoded signal $\hat{e}_n$;
   said automatic gain compression AGC stage further comprising means responsive to said decoded signal $\hat{e}_n$ for forming a decoded difference signal $\hat{d}_n$ in accordance with said signal $Y_n$;
   said predictor stage further comprising first adder means coupled to receive said predicted signal $\hat{x}_{pn}$ and said decoded difference signal $\hat{d}_n$, and having an output signal, means for deriving from said plurality of preceding samples $\hat{x}_n$ a plurality of coefficients $a_i(n)$, where $1 \leq i \leq N$, according to a predetermined algorithm, a plurality of multiplier means $M_1 \ldots M_N$ coupled to receive the output signal from said first adder, delay line means $T_1 \ldots T_N$ coupled between said first adder means and said respective multiplier means $M_1 \ldots M_N$, said delay line means $T_1 \ldots T_N$ providing respective delays of kT where $1 \leq k \leq N$, said plurality of multiplier means $M_1 \ldots M_N$ receiving said plurality of coefficients $a_i(n)$ respectively and having respective outputs, second adder means coupled to receive said outputs of said plurality of multiplier means $M_1 \ldots M_N$ and having an output for providing said signal $\hat{x}_{pn}$ predicted from said plurality of preceding samples $x_n$; and
   means respective to said plurality of coefficients $a_i(n)$ for comparing at least one of said coefficients $a_i(n)$ with a predetermined value to determine the statistical properties of said signal S, said comparing means being coupled to said quantizer stage for adapting the type of encoding to said statistical properties of said signal S.

2. A digit rate reducing system as claimed in claim 1, wherein said means for deriving said plurality of coefficients $a_i(n)$ further comprise N circuits, where $1 \leq i \leq N$, the $i^{th}$ circuit comprising:
   first multiplying means for multiplying said decoded difference signal $\hat{d}_n$ by a constant $\alpha$, and having an output,
   second multiplying means having two inputs and an output, one of said inputs coupled to the output of said first multiplying means, the second of said inputs coupled to receive the output of delay line means $T_i$;
   first adding means for adding the output of said second multiplying means and a coefficient $a_i(n-1)$ derived during the preceding period, and having an output;
   third multiplying means for multiplying the output of said first adding means by a constant $(1-\beta)$, and having an output;
   comparator means for selecting a coefficient $\hat{a}_{oi}(n-1)$ during the preceding period in accordance with the statistical properties of said signal S, and comprising fourth multiplying means for multiplying said coefficient $\hat{a}_{oi}(n-1)$ by a constant $\beta$, and having an output; and
   second adding means for adding the output of said third multiplying means and the output of said fourth multiplying means, and having an output for providing said coefficient $a_i(n)$.

3. A digit rate reducing system as claimed in claim 2, further comprising comparator means for receiving said coefficient $a_i(n)$ from the output of said second adding means, and for comparing said coefficient $a_i(n)$ to values corresponding to a limited domain, and for providing an output signal $a_i^*(n)$ corresponding to the closest value on the limit of the domain if the coefficient $a_i(n)$ is outside said limited domain.

* * * * *